(12) United States Patent
Debreceni et al.

(10) Patent No.: US 11,598,813 B2
(45) Date of Patent: Mar. 7, 2023

(54) METHOD AND APPARATUS FOR ESTIMATING A STATE OF CHARGE OF A BATTERY

(71) Applicant: Rolls-Royce Deutschland Ltd & Co KG, Blankenfelde-Mahlow (DE)

(72) Inventors: Tibor Debreceni, Budapest (HU); Gergely György Balazs, Budapest (HU); Peter Szabo, Budapest (HU)

(73) Assignee: Rolls-Royce Deutschland Ltd & Co KG, Blankenfelde-Mahlow (DE)

( * ) Notice: Subject to any disclaimer, the term of this patent is extended or adjusted under 35 U.S.C. 154(b) by 65 days.

(21) Appl. No.: 17/056,417

(22) PCT Filed: Jun. 6, 2019

(86) PCT No.: PCT/EP2019/064853
§ 371 (c)(1),
(2) Date: Nov. 17, 2020

(87) PCT Pub. No.: WO2019/234181
PCT Pub. Date: Dec. 12, 2019

(65) Prior Publication Data
US 2021/0215762 A1     Jul. 15, 2021

(30) Foreign Application Priority Data
Jun. 7, 2018  (EP) .................................. 18176500

(51) Int. Cl.
*G01R 31/367*   (2019.01)
*G01R 31/3828*  (2019.01)
(Continued)

(52) U.S. Cl.
CPC ......... *G01R 31/367* (2019.01); *G01R 31/388* (2019.01); *G01R 31/3828* (2019.01); *G01R 31/3842* (2019.01); *H01M 10/052* (2013.01)

(58) Field of Classification Search
None
See application file for complete search history.

(56) References Cited

U.S. PATENT DOCUMENTS

| | | | | |
|---|---|---|---|---|
| 2006/0238167 A1* | 10/2006 | Arai | .................... | G01R 31/3647 320/132 |
| 2011/0264390 A1* | 10/2011 | Shabra | .............. | H04W 52/0277 324/427 |
| 2013/0027047 A1 | 1/2013 | Yoshioka | | |
| 2015/0142352 A1* | 5/2015 | Fernandez | ......... | G01R 31/3842 702/63 |

(Continued)

FOREIGN PATENT DOCUMENTS

| | | |
|---|---|---|
| EP | 3064952 A1 | 9/2016 |
| JP | 2013134962 A | 7/2013 |
| WO | 2017122758 A1 | 7/2017 |

OTHER PUBLICATIONS

Yu et al., "An Open Circuit Voltage Model Fusion Method for State of Charge Estimation of Lithium-Ion Batteries", Energies 2021, 14, 1797 (Year: 2021).*

(Continued)

*Primary Examiner* — Brent A. Fairbanks
(74) *Attorney, Agent, or Firm* — Lempia Summerfield Katz LLC

(57) ABSTRACT

A state of charge of a battery is estimated by a battery model specific to the battery. The battery model provides a section-wise defined correlation of terminal voltage values depending on state of charge values. Each of sections of the battery model delimits a monotonic dependence of the correlation from others of the sections. By segmenting the correlation of terminal voltage values depending on a state of charge value into sections, each segment within such the section-wise defined correlation of terminal voltage values depending on state of charge values is mathematically spoken a bi-unique function suitable for transformation into an inverse function defined within the section.

(Continued)

The estimated state of charge may be continuously refined by an iterative feedback loop including coulomb counting for estimating a battery charge value, where refined estimated battery charge values state of charge values at a previous cycle are projected forward to the current cycle.

12 Claims, 2 Drawing Sheets

(51) Int. Cl.
*G01R 31/3842* (2019.01)
*G01R 31/388* (2019.01)
*H01M 10/052* (2010.01)
*H01M 10/48* (2006.01)

(56) References Cited

U.S. PATENT DOCUMENTS

2019/0025377 A1* 1/2019 Sejima ............... G01R 31/3832
2020/0049774 A1* 2/2020 Gao ................... G01R 31/3648

OTHER PUBLICATIONS

Yang et al., "Fast charging of lithium-ion batteries at all temperatures", PNAS, vol. 115, No. 28, Jul. 10, 2018 (Year: 2018).*
Lanjan et al., "Promoting lithium-ion battery performance by application of crystalline cathodes LixMn1-zFezPO4", Journal of Solid State Electrochemistry (2020) pp. 157-171. (Year: 2020).*
European Search Report for European Application No. 18176500.9-1022 dated Dec. 11, 2018.
International Search Report and the Written Opinion for International Patent Application PCT/EP2019/064853 dated Sep. 9, 2019.

* cited by examiner

FIG 1
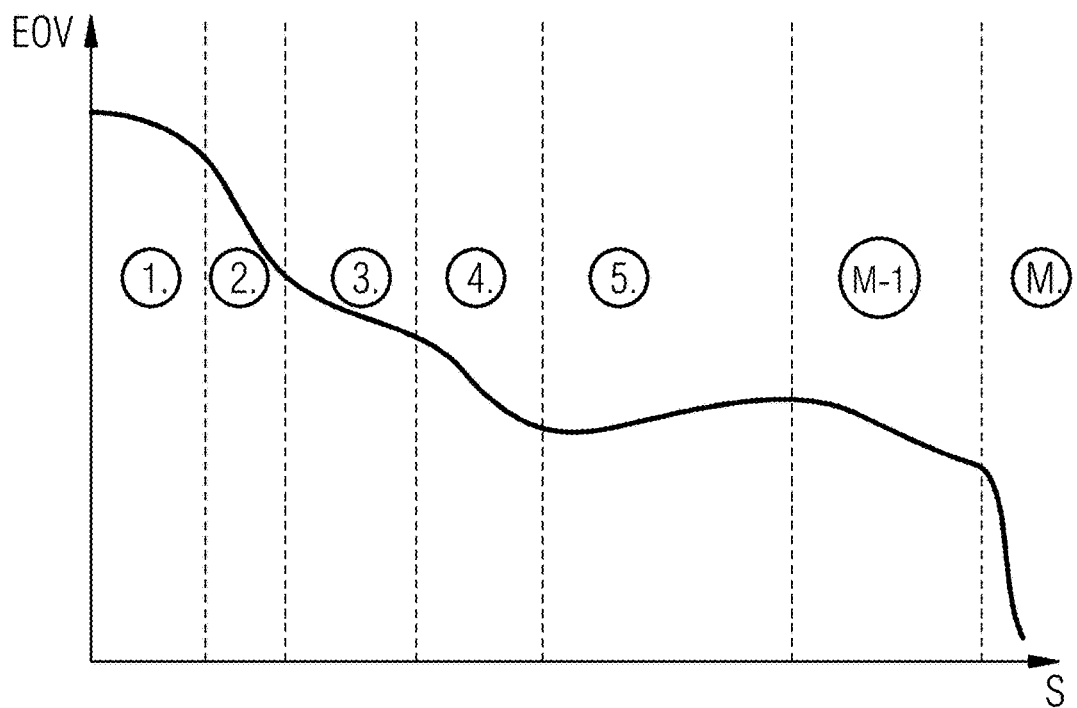
FIG 2  (State of the Art)
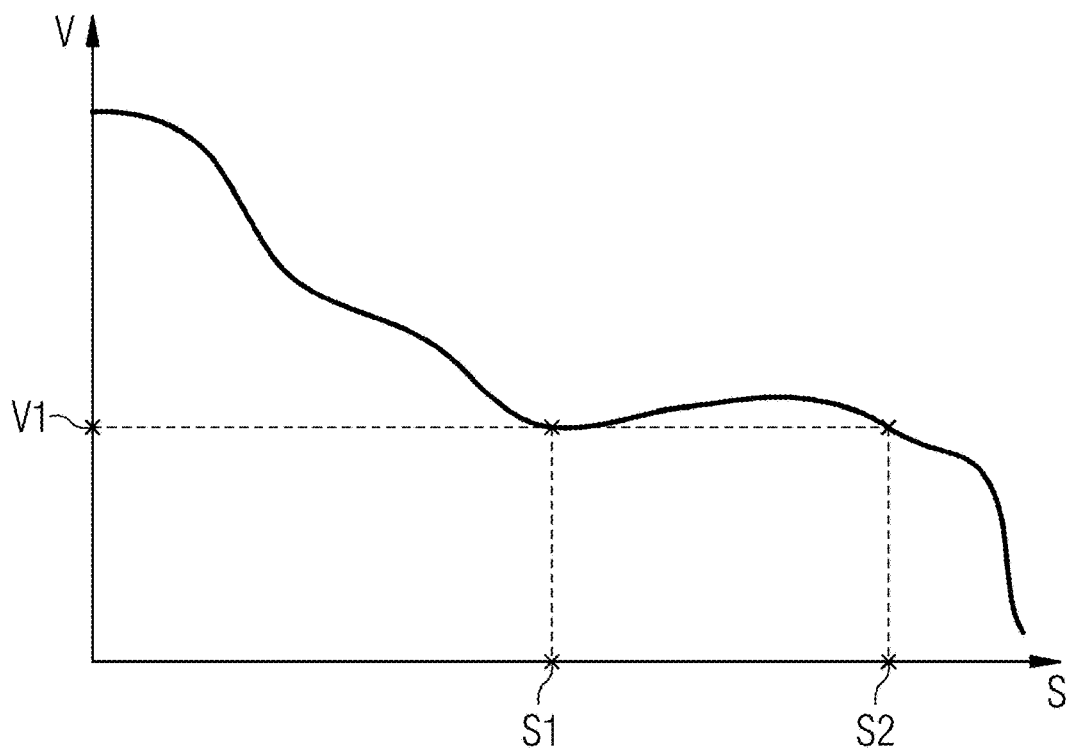

METHOD AND APPARATUS FOR ESTIMATING A STATE OF CHARGE OF A BATTERY

This application is the National Stage of International Application No. PCT/EP2019/064853, filed Jun. 6, 2019, which claims the benefit of European Patent Application No. EP 18176500.9, filed Jun. 7, 2018. The entire contents of these documents are hereby incorporated herein by reference.

TECHNICAL FIELD

The present embodiments generally relate a method and apparatus for estimating a state of charge of a rechargeable battery.

BACKGROUND

Rechargeable batteries have become increasingly important mainly to supply energy storages in stationary or e-mobility applications (e.g., electric vehicles such as cars and aircrafts) or electronic equipment such as mobile devices.

A state of charge value or SoC value indicates a usable capacity of the battery. This value is usually provided in percentage of a full capacity of the battery for maintenance personnel or an end user such as driver or a pilot. The state of charge cannot be measured directly as a quantity; the state of charge is estimated instead. As part of an energy storage system, a battery management system (BMS) is usually responsible for the estimation of the state of charge, which is crucial to be sufficient and reliable in safety- and life-critical applications.

Continuous monitoring of the state of charge of batteries is to be as accurate as possible for users in many applications to avoid a stoppage or an interruption of the operation of the equipment served by such batteries. Existing battery cell capacities may only be fully utilized by state-of-charge monitoring.

Devices for estimating the state of charge of batteries are known in the art. The state of charge estimation may be provided by the Battery Management System using data from voltage measurements of each battery cell potential and a load or charge current measurements imposed on the battery or a battery pack.

According to a method heretofore known, a terminal voltage value (e.g., a voltage of a battery while loads connected to the battery), an upper voltage limit defining the end of the battery charging cycle, and a lower voltage limit defining the end of the battery discharging cycle are measured. Between these ends, a non-linear behavior of the battery is considered by an estimation algorithm applying a non-linear battery model as a correlation (e.g., mathematically, a function) of a voltage value over the state of charge. Such battery model used for estimating the state of charge of a battery in operation may be provided beforehand using, for example, empirical methods of experimentally obtaining a function of an open circuit voltage value (e.g., the voltage of a battery without load) of a reference battery depending on a corresponding state of charge. The state of charge of a battery to be estimated may then be inferred by measuring the open circuit voltage and determining a respective state of charge according to the battery model. Instead of determining the open circuit voltage of the battery under regular conditions, a normal discharge process may be done, thereby adding a correction to the measured terminal voltage in order to determine open circuit voltage characteristics.

A major drawback of this method heretofore known is caused by an indeterminacy in inferring the state of charge derived from the non-linear function by a currently measured voltage value, as the function of the voltage value over the state of charge provided by the battery model may not always return a single state of charge value for a given voltage value. In other words, the function of the voltage value over the state of charge may return more than one state of charge value for a given voltage value.

SUMMARY AND DESCRIPTION

The scope of the present invention is defined solely by the appended claims and is not affected to any degree by the statements within this summary.

There is a need in the art for uniquely determining a state of charge estimation of a battery using a battery model for a given voltage value.

Embodiments for estimating a state of charge as described herein generally involve applying a battery model for estimating a state of charge of the battery by measuring at least a terminal voltage of the battery.

In one embodiment, a method for estimating a state of charge of a battery is disclosed. The method includes providing a battery model specific to the battery. The battery model provides a section-wise defined correlation of terminal voltage values depending on state of charge values, where each of the sections of the battery model delimits a monotonic dependence of the correlation from others of the sections. A terminal voltage value of the battery is measured, and one of the sections of the battery model is identified based on at least one operational condition of the battery. The method includes retrieving, within the identified section of the battery model, a state of charge value correlating to the measured terminal voltage. The retrieved state of charge value is returned as an estimated state of charge of the battery.

The method uses a correlation (e.g., mathematically, a function) included in a battery model. According to the correlation, each terminal voltage value is dependent on a state of charge value.

As the terminal voltage is known by a measurement in the measuring of the terminal voltage value of the battery, the inverse correlation (e.g., mathematically, inverse function) is to be determined (e.g., the state of charge value depending on the measured terminal voltage value). However, the inverse correlation of the voltage value over the state of charge value is not biunique, as the inverse correlation may return more than one state of charge value for a given voltage value.

Mathematically expressed, a transformation into an inverse function is not possible for a function in which the curve progression of the dependent value (e.g., the voltage value) is not strictly monotonically increasing or decreasing. A typical curve progression of the terminal voltage value as a function of the state of charge value is not monotonically decreasing, but in some parts, forms a constant progression or even an increasing curve progression, as illustrated in FIG. 2 of the drawing. This leads to a situation where the inverse function produces more than one state of charge value for a given voltage value, inhibiting a unique determination of the state of charge value for a given voltage value.

According to an embodiment, this problem is resolved by an approach of segmenting the correlation of terminal voltage values depending on a state of charge value into sections, where the correlation exhibits a monotonic dependence. A monotonic dependence is either a monotonic increasing or a monotonic decreasing of the curve progression.

Each function segment within such a section-wise defined function of terminal voltage values depending on state of charge values is mathematically spoken a biunique function suitable for transformation into an inverse function defined within the section.

This provides that the section-wise defined inverse correlation of the state of charge values depending on the known terminal voltage values produces exactly one state of charge value for one given terminal voltage value.

Applying the section-wise defined correlation within the battery model, the method provides an act of measuring the terminal voltage value of the battery, followed by an act of identifying the suitable section of the battery model. The identification of the section is based on at least one operational condition of the battery. Subsequently, a state of charge value correlating to the measured terminal voltage is determined within the identified section of the battery model. The determined state of charge value is then returned as an estimated state of charge of the battery.

According to an embodiment, the estimated state of charge is refined by a correction factor imposed to the determined state of charge. This correction factor is determined by coulometry principle where the quantity of energy delivered to or by the battery is determined and where a value of the remaining battery charge available for delivery is obtained from the difference between a nominal battery capacity and the energy delivered by the battery. The remaining battery charge so obtained is used for correcting the estimated state of charge.

According to an embodiment, an iterative feedback loop of estimating the state of charge is applied. The battery capacity and the estimated state of charge is refined at each time interval or cycle by operating as an iterative feedback loop projecting forward the refined battery capacity at the previous cycle to the current cycle and using the refined battery capacity at the previous cycle as one of the operational conditions for identifying one of the sections of the battery model.

According to an embodiment, the terminal voltage values of the battery model are expressed by equivalent open circuit voltage values, where the equivalent open circuit voltage values are compensated by a voltage drop in an internal impedance of the battery.

According to an embodiment, the operational conditions of the battery include one or more of a current load on the battery, a deemed open circuit voltage of the battery, an internal resistance or impedance of the battery, and/or a temperature of the battery.

In another embodiment, a battery management system for estimating a state of charge of a battery is provided. The battery management system includes a battery model, a measuring module, an indexing module, a correlation module, and an output module. The modules are carrying out the method for estimating the state of charge according to the embodiments as described above.

BRIEF DESCRIPTION OF THE DRAWINGS

FIG. 1 shows a section-wise defined correlation of a voltage of a battery as a function of a state of charge of the battery as used in a battery model according to an embodiment;

FIG. 2 shows a graph of a voltage of a battery as a function of the state of charge of the battery according to the state of the art.

DETAILED DESCRIPTION

Figure 3:
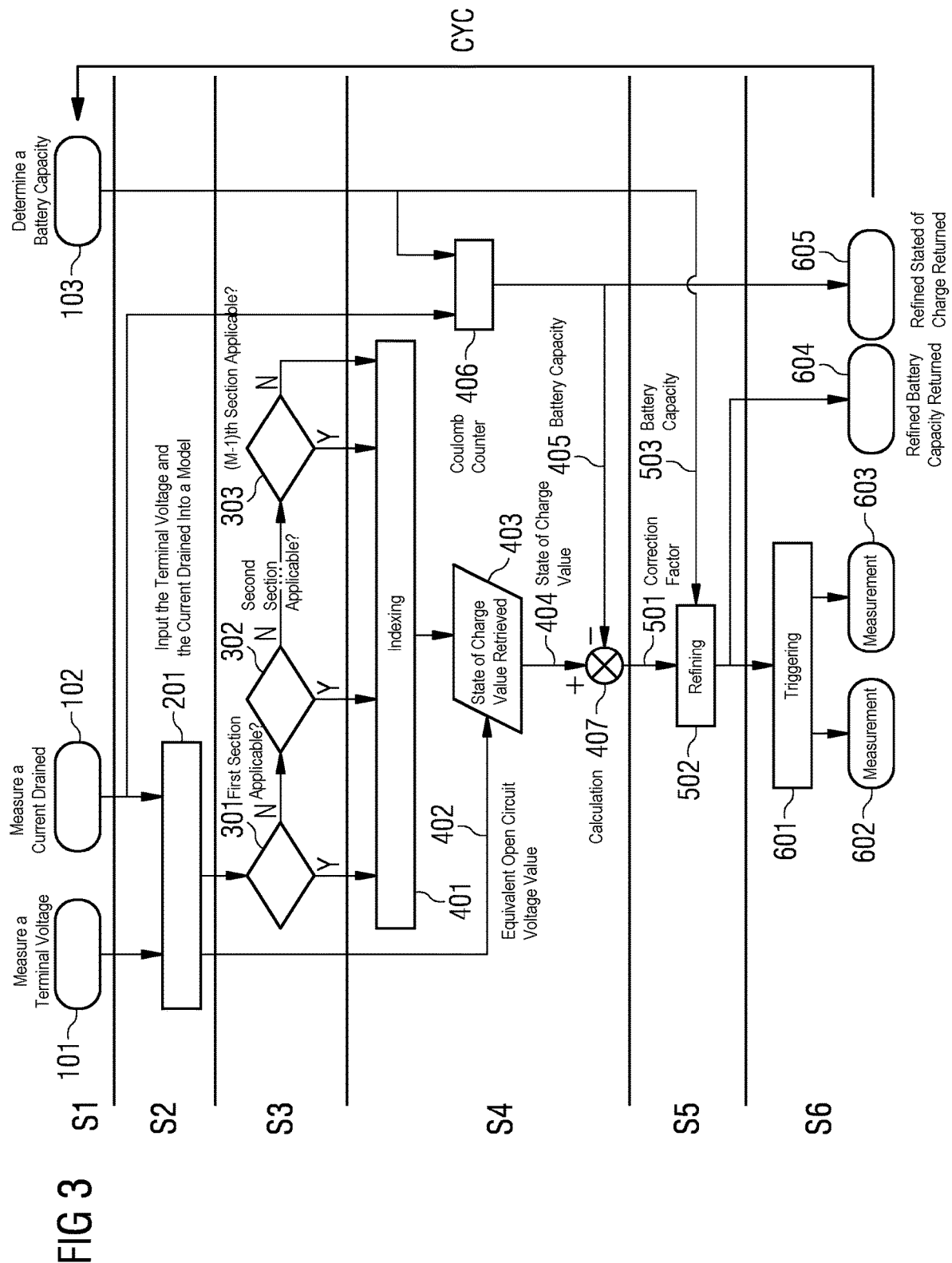
FIG. 3 shows a diagram illustrating an operational flowchart according to an embodiment.

FIG. 2 shows a graph of an open circuit voltage of a battery as a correlation or function of a state of charge of the battery, whereby parameters of this correlation may be stored in a battery model and used by a battery management system according to the state of the art.

The curve depicted in FIG. 2 shows an exemplary correlation of a battery voltage in dependency of the state of charge for a given battery operating at a pre-determined temperature. This correlation has been preemptively determined for a particular battery type, and the parameter values of the correlation have been stored in a parameter value resource (e.g., optionally a lookup table) of a battery model modelling the behavior of the battery according to the curve depicted in FIG. 2.

The pre-emptive determination of the parameter values may have been carried out either experimentally, derived empirically or semi-empirically based on tests of standard cells, by a deductive approach considering chemical and physical properties of the battery, or by a combination of the determination approaches. According to the exemplary correlation, a voltage value V on the ordinate of the coordinate system shown in FIG. 2 is dependent on a state of charge value S on the abscissa.

This method, which is also referred to as open circuit voltage-based (OCV) method, is based on the voltage measurement of a battery potential. Every battery technology has its own, distinct voltage characteristic, which has many dependencies. The most conspicuous dependency is the open circuit voltage (e.g., the voltage of a battery without load) depending on a state of charge of the battery. By measurements, this characteristic may be obtained. Measuring the voltage of the battery without load, the state of charge may be determined with good accuracy. A major drawback of this method is that the method may be used only with batteries in an idle operation and not during discharging or charging the battery, since the impedance of the battery alters the voltage significantly with the load current. Another drawback in using this method is a property of the voltage characteristics that curve progression is not monotonically decreasing. This property will be addressed hereinafter further below.

After the pre-emptive determination of the correlation of a battery voltage in dependency of the state of charge for a given battery has been stored has been finished, the parameter values of the correlation are stored in a parameter value resource of a battery model. The battery model now serves for an estimation of the state of charge.

As the open circuit voltage value V may be measured, the inverse correlation (e.g., mathematically, inverse function) is to be determined (e.g., the state of charge value S depending on the measured terminal voltage value V). However, the inverse correlation of the voltage value over the state of charge value is not biunique as the inverse correlation returns more than one state of charge value S1, S2 for a at least one voltage value V1, as depicted in the drawing. The reason for that is that the curve progression of the terminal voltage value V as a function of the state of charge value S is not monotonically decreasing, but in some parts, forms an increasing curve progression. This leads to a situation where the inverse function produces more than one state of charge value S1, S2 for a given voltage value V1, inhibiting a unique determination of the state of charge value for this voltage value V1.

Methods for a state of charge estimation using a battery model encounter a number of limitations that arise from the necessity of determining the inverse correlation: Certain types of batteries have a behavior, not shown in FIG. 2, in that there are more state of charge values belonging to the same voltage value in some circumstances. In the case of Lithium-ion or Li-Ion batteries, for example, when operated at low (e.g., temperatures below 0° C.) temperatures, a unique determination of the state of charge value for a measured voltage value is not possible. In other words, the inverse correlation of the voltage value over the state of charge value is not biunique for Li-Ion batteries operated at temperatures below 0° C. However, Li-Ion batteries operated at room temperature allow for a unique determination of the state of charge value for a measured voltage value. In other words, the inverse correlation of the voltage value over the state of charge value is biunique for Li-Ion batteries operated at room temperature. Other examples of batteries that allow for a unique determination of the state of charge value for a measured voltage value only in certain temperature ranges include LiFePo, LiPo, NiMH, NiZn, Lead-acid, and NiCd batteries. In the case of NiCd batteries, a unique determination is dependent of an absence of overcharging effects, which provides that a unique determination is not possible when overcharging effects occur or have occurred.

Other types of batteries (e.g., lithium-sulfur or Li—S batteries) have a behavior (shown in FIG. 2) where there are more state of charge values belonging to the same voltage value in all circumstances. In other words, the inverse correlation of the voltage value over the state of charge value is not biunique for Li—S batteries for all conditions.

Known methods of estimating the state of charge are partially applicable for widely used lithium-based batteries (e.g., Li-Ion batteries, lithium-polymer (Li—Po) batteries, or lithium-iron-phosphate (Li—Fe—Po) batteries), because behavior is such that there is one definite state of charge value belonging to one voltage level in some circumstances; this provides that the inverse correlation (e.g., mathematically, inverse function) of the discharge voltage characteristic of the cell is a function of state of charge or, alternatively, the depth of discharge (DoD).

Apart from the model-based method shown above, further methods of estimating the state of charge of a battery are known in the art, including a Coulomb-Counting (CC) method. The Coulomb-Counting is based on continuous measurements of discharge and/or charge currents on the battery. The current values are integrated over time in order to determine the already used capacity of the battery. Comparing this value to the nominal capacity, the state of charge may be estimated. A major drawback of this method is a drift error in the estimated capacity that is caused by a constantly accumulated deviation due to the integration.

FIG. 1 shows a section-wise defined correlation of a voltage of a battery as a function of the state of charge of the battery as used in a battery model according to an embodiment.

This embodiment is essentially based on the idea of splitting the curve of the voltage characteristics of the battery known from FIG. 2 into a number of sections 1, 2, 3, . . . M−1, M, as a function of a state of charge. The sections 1, 2, 3, . . . M−1, M are symbolized by an encircled ordinal number in the drawing.

Unlike the example shown in conjunction with FIG. 2, the embodiment according to FIG. 1 uses an equivalent open circuit voltage EOV as a unit on the ordinate of the depicted coordinate system. The resulting characteristic is hereinafter referred to as »Equivalent Open Circuit Voltage Characteristic« or EOCVC.

Equivalent open circuit provides that the voltage characteristic of the battery is compensated in order to be independent from any currents, which may be due to impedance. The terminal voltage values of the battery model, in other words, are expressed by equivalent open circuit voltage values EOV, where the equivalent open circuit voltage values EOV are compensated by a voltage drop in an internal impedance of the battery caused by a current drained off the battery.

Splitting the Equivalent Open Circuit Voltage Characteristic results in a number M of sections 1, 2, 3, . . . M−1, M, where in each section the correlation exhibits a monotonic dependence. According to the exemplary curve shown in FIG. 1, the curve is strictly monotonic decreasing in sections 1, 2, 4, M−1, and M and strictly monotonic increasing in section 5. By applying mathematical derivation methods, such as dEOV/dS or derivations of a higher order, a sufficient number of sections may be determined. The more sections may be distinguished, the more accurate the estimation of the state of charge will be.

Each function segment within such a section-wise defined function of equivalent open circuit voltage values EOV depending on state of charge values S is mathematically spoken a biunique function suitable for transformation into an inverse function defined within the section 1, 2, 3, . . . M−1, M.

This provides that the section-wise defined inverse correlation of the state of charge values S depending on the known open circuit voltage values EOV produces exactly one state of charge value for one given terminal voltage value within the actually selected section 1, 2, 3, . . . M−1, M.

Applying the section-wise defined correlation within the battery model, the embodiment provides a step of measuring the terminal voltage value or the open circuit voltage values EOV of the battery, followed by a step of identifying the suitable section 1, 2, 3, . . . M−1, M of the battery model, where the identification of the section 1, 2, 3, . . . M−1, M is based on at least one operational condition of the battery. Subsequently, a state of charge value S correlating to the measured terminal voltage is determined within the identified section 1, 2, 3, . . . M−1, M of the battery model.

The section-wise defined correlation within the battery model is beneficial for both types of batteries as stated above, including both: types of batteries that have a behavior in that there are more state of charge values belonging to the same voltage value in some circumstances (e.g., Li-Ion batteries); and types of batteries that have a behavior in that there are more state of charge values belonging to the same voltage value in all circumstances (e.g., Li—S batteries).

The benefits of the section-wise defined correlation are due to the fact that operational circumstances are not to be regarded for applying the inverse correlation. These circumstances are considered within the battery model.

FIG. 3 shows a diagram illustrating an operational flow-chart according to a further embodiment. According to this embodiment, the estimated state of charge is continuously refined by an iterative feedback loop CYC including a measurement of parameters and retrieving of parameters within the battery model, where refined estimated state of charge values at a previous cycle are projected forward to the current cycle.

Within a first section S1 of the operational flowchart, an act 101 of measuring a terminal voltage value of the battery, an act 102 of measuring a current drained of the battery, and an act 103 of determining a battery capacity is provided. The battery capacity, which usually expresses a difference between a nominal capacity of the battery and the hitherto used capacity, used in the current cycle of the iterative feedback loop CYC was determined in a previous cycle.

Within a second section S2 of the operational flowchart, an act 201 of inputting the terminal voltage value and the current value into a battery model is provided. An equivalent open circuit voltage value 402 is determined by a difference of the terminal voltage value of the battery measured in act 101 and the voltage drop in a known internal impedance caused by the current value drained off the battery measured in act 102. According to an embodiment, the known internal impedance and/or resistance is included in the battery model and retrieved therefrom.

Within a third section S3 of the operational flowchart, a sequence of identifying a section within the battery model based on at least one operational condition of the battery is provided. The operational condition may include a battery capacity of a previous cycle in order to coarsely identify the location on an abscissa of the correlation represented within the battery model, thereby uniquely identifying the section on the state of charge portion of the abscissa.

In a first decision step 301, a first decision is made of whether the first section within the battery model is applicable. If the first section is applicable, which is represented by a branch Y (»Yes<«) pointing vertically downward from decision step 301, a subsequent act 401 is carried out. If the first section is not applicable, represented by a branch N (»No«) pointing horizontally to the right from decision step 301, a subsequent decision step 302 is carried out. In the subsequent second decision step 302, a second decision is made of whether the second section within the battery model is applicable. If the second section is applicable, which is represented by a branch Y (»Yes<«) pointing vertically downward from the second decision step 302, the subsequent act 401 is carried out. If the second section is not applicable, represented by a branch N (»No«) pointing horizontally to the right from the second decision step 302, a subsequent (not shown) decision step between decision step 302 and decision step 303 is carried out. The sequence of decision steps continues (symbolized by three dots in the drawing) until an ordinal number equal to the number M of sections of the battery model has been reached. In the final (M−1)th decision step 303, a decision is made of whether the (M−1)th section within the battery model is applicable. Regardless of whether the (M−1)th section is applicable or not, which is represented by a branch Y (»Yes<«) and a branch N (»No«), both pointing vertically downward from the final decision step 303, the subsequent step 401 is carried out.

Within a fourth section S4 of the operational flowchart, the act of indexing 401 by an indexing module returns the identified section number within the battery model. In act 403, the state of charge value 404 correlating to the measured terminal voltage is retrieved within the identified section of the battery model, thereby using the equivalent open circuit voltage value 402. This state of charge value retrieved within the identified section of the battery model is returned as estimated state of charge 404 of the battery.

In a coulomb counting act 406, a battery charge 405 determined in the current cycle of the iterative feedback loop is calculated using a differentially used capacity (e.g., a capacity used in the currently operated cycle) by integrating over time the current value measured by act 102 and the battery capacity 103 that was determined in the previous cycle and delivered by act 103. The calculated battery charge 405 is the battery charge 405 in the current cycle. A refined state of charge, derived as a quotient of the calculated battery charge 405 and the nominal battery capacity, is returned by act 605.

By a calculation act 407 (symbolized by a crossed circle in the drawing), the determined state of charge derived by the battery charge 405 in the current cycle and the estimated state of charge 404 are used to calculate a correction factor 501. According to an embodiment, the correction factor 501 is calculated as a difference between the estimated state of charge 404 and the determined state of charge derived by the battery charge 405 in the current cycle, as symbolized by the »+« and »−« symbols in the drawing.

Within a fifth section S5 of the operational flowchart, the correction factor 501 is fed to a refining act 502 for refining the battery capacity 503 delivered by act 103 from the previous cycle by refining the battery capacity 503 from the previous cycle with the correction factor 501. According to an embodiment, the refining act 502 includes the calculation of $$Q_B(N)=Q_B(N-1)\times[(100+CF)/100]$$

where:
$Q_B(N)$ denotes the refined battery capacity determined within the current cycle N;
$Q_B(N-1)$ denotes the battery capacity 503 delivered by step 103 from the previous cycle N−1; and
CF denotes the correction factor 501.

The refined battery capacity determined within the current cycle is returned by act 604. This refined battery capacity determined within the current cycle is returned by act 604 to the subsequent cycle CYC where the refined battery capacity will be used (e.g., equivalently to the former act 103) as a new value for the battery capacity in the subsequent cycle. In the index counting used in the formula above, this subsequent cycle would have an index of N+1. In other words, the act of refinement is updating the value of the nominal capacity, and that is looped back to the Coulomb Counter 406 in the next act.

Within a sixth section S6 of the operational flowchart, an act 601 of triggering new measurement acts 602,603 and repeating the cycle by a feedback loop CYC is carried out. These new measurement acts include a act 602 of measuring the terminal voltage value of the battery and the act 603 of measuring the actual current drained of the battery. The acts 602, 603 are equivalently used as acts 101, 102 in the preceding cycle.

The acts described above may be executed by a battery management system interfacing a digital and/or analog data representation of a battery model 201, a measuring module (not shown) configured to carry out the acts 101, 102, 602, 603, an indexing module (not shown) operable to carry out the acts 301, 302, 303, 401, a correlation module (not shown) operable to carry out the act 403, and an output module to carry out the act 604.

According to the embodiments, a state of charge of a battery is estimated by a battery model specific to the battery. The battery model provides a section-wise defined correlation of terminal voltage values depending on state of charge values, where each of the sections of the battery model delimits a monotonic dependence of the correlation from others of the sections. By segmenting the correlation of terminal voltage values depending on a state of charge value into sections, each segment within such the section-wise defined correlation of terminal voltage values depending on state of charge values is mathematically spoken a bi-unique function suitable for transformation into an inverse function defined within the section.

According to an embodiment, the estimated state of charge is continuously refined by an iterative feedback loop including a coulomb counting for estimating a battery charge value. Refined estimated battery charge values and state of charge values at a previous cycle are projected forward to the current cycle.

According to an embodiment, an iterative feedback loop execution unit (not shown) is executing an iterative feedback loop CYC projecting forward the battery charge at a previous cycle to the current cycle and using a correction factor in order to return a refined estimated state of charge of the battery.

According to an embodiment, the acts 407, 502 of calculating the correction factor and refining the estimated state of charge by the correction factor are executed by a correction module (not shown).

According to an embodiment, the coulomb counting act 406 is executed by a coulomb counting module (not shown).

The embodiments allow for an easy implementation in a battery management system due to the fact that complex computation time and power demanding operations are not necessary. The embodiments provide reliable state of charge values even in implementations where a signal-to-noise-ratio (SNR) of the voltage and current measurements is of a rather low quality.

As the embodiments solely use simple mathematical operations along with scalar values (e.g., instead of using matrix operations like in Kalman filters), an implementation in real-time systems using standard microcontroller-based battery management systems is suitable and results in low costs for development.

The embodiments are of an adaptable and scalable nature. Merely by changing certain parts modules (e.g., the battery model) the modules may be re-used for all kinds of battery technologies. Even the implemented algorithm is independent from voltage and current levels, so that the implemented algorithm may be reused for battery cells, battery packs, or modules as well.

In order to customize to a specific application with a specific battery cell, only a parameterization update is needed. Changing the battery technology only requires a parameter table update within the battery model.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding or following claim, whether independent or dependent, and that such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for estimating a state of charge of a battery, the method comprising:
providing a battery model specific to the battery, the battery model providing a section-wise defined correlation of terminal voltage values depending on state of charge values, wherein a curve of the section-wise defined correlation is strictly monotonic decreasing in a number of sections and strictly monotonic increasing in another section, and wherein each of sections of the battery model delimits a monotonic dependence of the correlation from others of the sections;
measuring a terminal voltage value of the battery;
identifying one of the sections of the battery model based on at least one operational condition of the battery;
retrieving, within the identified one section of the battery model, a state of charge value correlating to the measured terminal voltage; and
returning the retrieved state of charge value as an estimated state of charge of the battery, the returning comprising displaying the retrieved state of charge value as the estimated state of charge value of the battery, such that stoppage or an interruption of operation of equipment powered by the battery is avoidable.

2. The method of claim 1, further comprising:
determining a used capacity within a current cycle, the determining of the used capacity within the current cycle comprising integrating a measured current drained of the battery over time within a current cycle;
determining a battery capacity in the current cycle, the determining of the battery capacity in the current cycle comprising using a battery capacity of a preceding cycle and the used capacity within the current cycle;
calculating a correction factor using the battery capacity in the current cycle and the state of charge value determined by the retrieving; and
refining the battery capacity determined within the current cycle, the refining of the battery capacity determined within the current cycle comprising multiplying the determined battery capacity with the correction factor.

3. The method of claim 2, further comprising refining the battery capacity at each cycle by operating as an iterative feedback loop projecting forward the battery capacity at a previous cycle to the current cycle and using a correction factor in order to return a refined battery capacity.

4. The method of claim 3, wherein the terminal voltage values of the battery model are expressed by equivalent open circuit voltage values, the equivalent open circuit voltage values being compensated by a voltage drop in an internal impedance of the battery.

5. The method of claim 3, wherein the operational condition of the battery includes a current load on the battery, a deemed open circuit voltage of the battery, an internal impedance of the battery, an internal resistance of the battery, a temperature of the battery, or any combination thereof.

6. The method of claim 2, wherein the terminal voltage values of the battery model are expressed by equivalent open circuit voltage values, the equivalent open circuit voltage values being compensated by a voltage drop in an internal impedance of the battery.

7. The method of claim 2, wherein the operational condition of the battery includes a current load on the battery, a deemed open circuit voltage of the battery, an internal impedance of the battery, a temperature of the battery, or any combination thereof.

8. The method of claim 1, wherein the terminal voltage values of the battery model are expressed by equivalent open circuit voltage values, the equivalent open circuit voltage values being compensated by a voltage drop in an internal impedance of the battery.

9. The method of claim 8, wherein the operational condition of the battery includes a current load on the battery, a deemed open circuit voltage of the battery, an internal impedance of the battery, an internal resistance of the battery, a temperature of the battery, or any combination thereof.

10. The method of claim 1, wherein the operational condition of the battery includes a current load on the battery, a deemed open circuit voltage of the battery, an internal impedance of the battery, an internal resistance of the battery, a temperature of the battery, or any combination thereof.

11. A battery management system for estimating a state of charge of a battery, the battery management system comprising:

a battery model specific to the battery, the battery model providing a section-wise defined correlation of terminal voltage values depending on state of charge values, wherein a curve of the section-wise defined correlation is strictly monotonic decreasing in a number of sections and strictly monotonic increasing in another section, and wherein each of sections of the battery model delimits a monotonic dependence of the correlation from others of the sections;

a measuring module configured to measure a terminal voltage value of the battery;

an indexing module operable to identify one of the sections of the battery model based on an operational condition of the battery;

a correlation module operable to retrieve, within the identified one section of the battery model, a state of charge value correlating to the terminal voltage; and an output module for returning the retrieved state of charge value as an estimated state of charge of the battery, such that the retrieved state of charge value is displayed as the estimated state of charge of the battery and stoppage or an interruption of operation of equipment powered by the battery is avoidable.

12. The battery management system of claim 11, further comprising an iterative feedback loop execution unit configured for executing an iterative feedback loop projecting forward a battery capacity value at a previous cycle to a current cycle and using a correction factor, such that a refined estimated state of charge of the battery is returned.

* * * * *